United States Patent [19]

Haond

[11] Patent Number: 4,773,964
[45] Date of Patent: * Sep. 27, 1988

[54] PROCESS FOR THE PRODUCTION OF AN ORIENTED MONOCRYSTALLINE SILICON FILM WITH LOCALIZED DEFECTS ON AN INSULATING SUPPORT

[76] Inventor: Michel Haond, 5, rue d'Oisan, 38240 Meylan, France

[*] Notice: The portion of the term of this patent subsequent to Jul. 2, 2004 has been disclaimed.

[21] Appl. No.: 854,385

[22] Filed: Apr. 21, 1986

[30] Foreign Application Priority Data

Apr. 19, 1985 [FR] France ................. 84 06001

[51] Int. Cl.$^4$ ............ H01L 21/306; B44C 1/22; C03C 15/00; C03C 25/06
[52] U.S. Cl. .................. 156/603; 156/617 R; 156/620; 156/643; 156/644; 156/646; 156/647; 156/653; 156/657; 156/659.1; 156/662; 427/86; 437/228
[58] Field of Search ............ 156/643, 603, 617 R, 156/620, 644, 646, 647, 653, 657, 659.1, 662; 427/86

[56] References Cited

U.S. PATENT DOCUMENTS 4,678,538 7/1987 Haond et al. ................. 156/643

FOREIGN PATENT DOCUMENTS 2537607 6/1984 France.

OTHER PUBLICATIONS

*Journal of Applied Physics*, vol. 55, No. 6, S. Kawamura et al, "Laser Recrystallization of Si Over SiO$_2$ With a Heat-Sink Structure", pp. 1607–1609, Mar. 1984.
*Patents Abstracts of Japan*, vol. 9, No. 71 (C-272), 1794, 3/30/85; and JPA No. 59-203791 (Kogyo Gijutsuin), 11/17/84.

*Primary Examiner*—Asok Pal
*Attorney, Agent, or Firm*—Oblon, Fisher, Spivak, McClelland & Maier

[57] ABSTRACT

This process consists of producing in the insulating support a periodic configuration which, in the form of regularly spaced parallel insulating strips, has overhanging and recessed parts, the width of the overhanging parts being smaller than that of the recessed parts; depositing on the complete structure obtained a silicon film; covering the silicon film with an encapsulating material layer; carrying out heat treatment in order to recrystallize the silicon film in monocrystalline form, said treatment consisting of locally melting the silicon film and displacing the melted zone parallel to the insulating strips, the melted zone being in the form of a line perpendicular to said strips, followed by the elimination of the encapsulating material layer.

17 Claims, 2 Drawing Sheets

PROCESS FOR THE PRODUCTION OF AN ORIENTED MONOCRYSTALLINE SILICON FILM WITH LOCALIZED DEFECTS ON AN INSULATING SUPPORT

BACKGROUND OF THE INVENTION

The present invention relates to a process for the production of an oriented monocrystalline silicon film with localized defects on an insulating support.

It more particularly applies to the field of producing MOS or bipolar integrated circuits, particularly with a g high operating speed, which resist ionizing radiations and/or opening under high voltage and being able to dissipate high power levels. It also applies to the production of the control circuits of matrix flat screens on transparent amorphous substrates, such as glass.

Silicon-on-insulant technology constitutes a significant improvement compared with standard technologies in which the active components of the integrated circuits are directly produced on a monocrystalline solid silicon substrate. Thus, the use of an insulating material leads to a significant decrease in the parasitic capacitances between the source and substrate on the one hand and the drain and substrate on the other of the active components of the integrated circuits and consequently to an increase in the operating speed of said circuits.

Moreover, this technology makes it possible to significantly decrease the parasitic charges introduced into the integrated circuits operating under ionizing radiation, in view of the fact that such radiations cannot ionize the insulating support on encountering a solid silicon support. Moreover, this technology makes it possible to increase the integration density of the integrated circuits, because they make it possible to avoid latch-up due to the breakdown of the junctions of said integrated circuits. Finally, this technology leads to a significant simplification of the processes for producing integrated circuits, as well as to a better resistance of said circuits to high voltages.

The obtaining of monocrystalline semiconductor films and in particular silicon films on insulating supports has been studied with a view to producing flat screens and there control circuits on transparent amorphous substrates. When the first experiments using laser beams or electron beams revealed that it was possible to grow silicon grans by heating them and particularly by melting the deposited silicon, as a result of a zone micromelting, increased activity took place with a view to obtaining monocrystalline silicon films on an insulating support.

This lead to a search for methods making it possible to rapidly treat industrial silicon wafers, as well as the search for heating devices with a lower cost than a laser source or an electron gun. Thus, use was made of graphite resistors or filament or arc lamps. These heating devices have more particularly been described in an article by M. W. GEIS et al, which was published in Applied Physics Letters, 37, May 1980, p454 and in French patent application No. 2 532 783 of 7.9.1982.

Unfortunately, none of these known heating methods has made it possible to produce monocrystalline silicon films without defects over the entire surface of a silicon wafer with industrial dimensions (diameter 100 mm).

All the experiments would seem to show that, even with non-coherent energy beams permitting the recrystallization of entire silicon wafers in a single passage, it is difficult to envisage eliminating the residual defects, such as grain boundaries and subboundaries or other dislocations. This is even more true in view of the fact that silicon films are thin, i.e. having a thickness below 0.5 $\mu$m.

Moreover, in order to orient the recrystallized semiconductor film, attempts where made to use a fine grating etched in the insulating support in the manner described by M. M. GEIS et al, in Appl Phys Lett, H 35, July 1979, pp 71-74 "crystallographic orientation of silicon on an amorphous substrate using an artificial surface - relief grating and laser crystallization". Unfortunately the methods used in silicon zone melting, like those described in the article by M. W. GEIS and an FR-A-2 532 783 did not make it possible to obtain completely oriented, defect-free, recrystallized silicon wafers.

One of the most frequently used methods for obtaining a monocrystalline silicon film on an insulating support consists of forming on a monocrystalline silicon substrate of given orientation, a silicon oxide film, particularly by thermal oxidation and then depositing on the said film a polycrystalline silicon film and finally the film undergoes heat treatment, such as a scanning of a melted zone of the film in order to recrystallize the silicon.

In such a procedure, consideration was given to making openings in the silicon oxide film so as to use the monocrystalline substrate as a recrystallization germ or nucleus in order to orient the recrystallized film and prevent its disorientation, which are the main reasons why grain boundaries and subboundaries appear. This nucleation process is particularly described in the article by M. FEN published in Appl Phys Lett, 38, 1981, p 365.

In this procedure, it appeared necessary to reproduce with a short period (less than 500 $\mu$m) the so-called nucleation openings in the silicon oxide film so as not to loose the initial orientation. However, this leads to the disadvantage of requiring, following the recrystallization of the silicon film, a localized oxidation stage of said nucleation zones in order to insulate the recrystallized semiconductor film from the monocrystalline substrate and to the be able to use the different, aforementioned advantages as compared with the silicon on-insulant technology. Moreover, there oxidized zones lead to a space loss, because it is not possible to produce integrated circuits insulated from one another on these oxidized zones.

Moreover, an investigation has taken place of the formation an appearance of grain boundaries and subboundaries with a view to discovering localization procedures for these defects in narrow zones where the active zones (the transistor gates) of the integrated circuits are not produced. In particular, by recrystallizing the semiconductor film on the insulating support by scanning a melted silicon zone, it was found that the boundaries and subboundaries of the grains formed in the zones which solidified last after the passage of the melted zone.

By using in this recrystallization method a laser source, where the energy can be concentrated on a very narrow spectrum, it is possible to couple to a greater or lesser extent the energy of the laser beam with the semiconductor film and to heat to a greater or lesser extent a particular zone of said film as compared with another zone. This can be realized, in the manner described in French patent application No. 83 16396 by using antireflecting parallel strips on the silicon film to be crystallized and which act as crystallization delaying means, and by calculating the thickness of the antireflecting strips and the reflecting strips (silicon strips), in order to adjust the energy of the laser beam interacting with the silicon film.

However, in the case of an incoherent light source, in view of the broad emission spectrum thereof, it is difficult to adjust the thickness of the reflecting and antireflecting strips in order to attempt to bring into phase the light waves striking the structure. However, as described in the article M. W. GEIS et al, published in J Electrochem Soc: Solid-state Science and Technology 130, pp 1178-1183 of May 1983 and entitled "Solidification-Front Modulation to Entrain Subboundaries in Zone Melting Recrystallization of Si on SiO$_2$", use was made of black bodies or metal layers for their relecting properties in a broad spectrum.

In the same way, in an article by D. BENSAHEL, et al published in Electronics Letters of 23.6.1983, vol 19, No. 13, pp 464-466 and entitled "Localization of defects on SOI films via selective recrystallization using halogen lamps", use was made of deposited layers of different index as rough refractive index adapting means without using limited calibrated thicknesses.

In another process for the localization of residual defects in a recrystallized silicon film, the isotherms of the semiconductor melted zone where modified using a selective diffusion of the heat in the underlying substrate and varying the thickness of the silicon oxide film supporting the semiconductor film. This process using a laser source as the heating source was described in an article by S. KAMAMURA et al, published in J Appl Phys, 55 (6) of 15.3.1984, pp 1607 to 1609 entitled "Laser recrystallization of Si over SiO$_2$ with a heat sink structure".

When it is possible to localize the different recrystallization defects of the silicon film, as described hereinbefore, the main remaining problem is that of the crystalline orientation of the recrystallized film. If with non-coherent energy beams the recrystallized film has a texture (100) perpendicular to the plane of the film, in the case of laser beams this film is not generally oriented and it is necessary to use germination openings towards the monocrystalline substrate made in the silicon oxide film. However, in the case of non-coherent energy beams, the silicon film remains disoriented in the plane of the film. The disorientation is approximately 30° compared with the displacement direction of the melted zone.

In the case of non-coherent energy beams, other problems remain and in particular the behavior of the semiconductor films during zone melting. Thus, when the silicon is liquid and in contact with the silicon oxide, which is generally used as the insulating support, the silicon does not wet the insulant and has the tendency to form drops. In addition, it is necessary to find an effective "encapsulant", i.e. an element enclosing the semiconductor film making it possible to maintain the latter in contact with the insulating support and consequently prevent silicon drop formation, so as to limit the melted silicon mass transfer.

At present, it is attempted to prevent drop formation by covering the silicon film with a thick silicon oxide or silicon nitride layer (2 $\mu$m for a 0.5 $\mu$m silicon film). However, even with such material thicknesses, the silicon sometimes undergoes droplet formation, so that completely unusable silicon wafers are obtained.

SUMMARY OF THE INVENTION

The present invention relates to a process for the production of a monocrystalline silicon film on an insulating support making it possible to obviate the aforementioned disadvantages. This process, using the zone melting procedure for forming the monocrystalline semiconductor film, permits a precise localization of the crystallization defects and the formation of silicon monocrystals oriented perpendicularly to the plane of the silicon film.

More specifically, the present invention relates to a process for the production of a monocrystalline silicon film on an insulating support comprising the following successive stages:

(a) producing in an insulating support by etching the latter, overhanging insulating strips and recessed insulating strips, which are parallel and alternate, the width of the overhanging strips being less than that of the recessed strips, (b) deposition on the complete structure obtained of a silicon film, (c) covering the silicon film with an encapsulating material layer, (d) carrying out a heat treatment to the structure obtained in order to recrystallize the silicon film in monocrystalline form, said treatment consisting of locally melting the silicon film and moving the melted zone parallel to the insulating strips, the melted zone being in the form of a line perpendicular to said strips and (e) eliminating the encapsulating material layer.

The production, by etching the insulating support, of overhanging and recessed strips, which are parallel to one another permits a good localization of the residual crystallization defects of the silicon film.

Thus, the overhanging strips or parts ensure the localization of the boundaries and subboundaries of the grains as a result of a modulation of the isotherm of the crystallization front. Solidification is delayed in the thickest insulating zones (overhanging parts), due to the heat conductivity difference between the thick insulant and the thin insulant. Thus, the crystallization defects are localized just above the insulating steps.

Moreover, the configuration of the overhanging and recessed strips makes it possible to prevent the melted silicon from forming into drops on the insulant, when the latter is of silicon oxide, which in particular permits the use of thicker encapsulating material layers than in the prior art. However, if by chance the silicon does form into a drop, the liquid will still remain confined between the two overhanging parts, it being difficult to pass beyond said overhanging parts or steps.

Advantageously, use is made of a periodic configuration, in which the overhanging strips and recessed strips are regularly spaced. During the heat treatment, this permits a homogeneous distribution of the energy absorbed and diffused in the silicon film and along the melted zone, which is perpendicular to the insulating strips.

The use of a periodic configuration is of particular interest for subsequent technological treatment reasons (production of integrated circuits). Thus, designers of integrated circuits wish to have the maximum possible monocrystalline regions without any defects. when a critical width of the recessed insulating parts has been determined, it is preferable to repeat it in order to avoid a space loss in the case of a reduction of said width. or the appearance of defects in the case of an increase of said width. Moreover, a periodic configuration can be of interest during the production of periodically produced circuitis or components (matrix, memory, prediffused gratings, etc).

In order to reinforce the localization of the recrystallization defects, it is possible to advantageously form, prior to stage (d), on the encapsulating material layer and above each overhanging strip, an antireflecting strip, e.g. of silicon nitride of the same width as the associated overhanging strip. These antireflecting strips serve to delay crystallization and reinforce the modulation of the isotherm on the solidification front.

In order to guide the crystalline orientation of the recrystallized silicon film, the melted zone will be moved at a slow speed, i.e. below 0.5 mm/s. Preferably, the melted zone displacement speed varies from 0.1 to 0.2 mm/s.

Advantageously, the melted silicon zone in the form of line perpendicular to the overhanging and recessed insulating strips, is obtained by subjecting the complete structure to the action of an energy line, perpendicular to said insulating strips and moving parallel thereto. Preferably, the energy line is obtained by focusing the energy of a linear lamp located at the focus of an eliptical reflector. It can also be formed by rapidly scanning the surface of the encapsulating material layer with a laser beam or electron beam, in a direction perpendicular to the insulating strips.

According to a preferred embodiment of the inventive process, by etching the insulating support, in each recessed part is formed at least one notch, said notches being in the form of strips which are parallel to one another and to the overhanging parts. Preferably, each of the notch is formed in the centre of a recessed part.

The production of these notches contributes greatly to the orientation of the silicon film parallel to the displacement direction of the melted zone due to the grapho-epitaxy effect in the silicon zone which solidifies first. The zone containing these notches supplies the nuclei having the correct orientation of (100) parallel to the strips. The orientation of the recrystallized film results from a minimization of the energy between the oxide and the oriented silicon (100), i.e. whereof the (100) planes are parallel to the oxide surface. Thus, the bottom and sides of the notch parts, as a result of the energy minimization, will supply nuclei oriented (100) parallel to the notch strips, which thus form the source nuclei for the longitudinal nucleation, parallel to the overhanging and recessed insulating strips. These nuclei remain solid at the start of melting on the border of the melted zone.

The effectiveness of this orientation selection increases if the deposited film is of amorphous silicon and/or when the deposited silicon film is of polycrystalline silicon having small grains compared with the size of notches.

If need be, it is possible to flatten or level the surface of the deposited silicon film prior to recrystallization. This can advantageously be carried out by the so-called planarization method consisting of covering the silicon film with a layer of an insulating material, particularly a resin of the type generally used in photolithography, followed by the simultaneous etching of the insulating material layer and the silicon film at identical etching speeds for insulant and silicon, until the insulant and the relief parts of the silicon film are eliminated.

Advantageously the etching of the insulating support for forming the periodic configuration and/or the notches is carried out by reactive ionic etching, thus making it possible to obtain rigid etched edges perpendicular to the insulating support surface. These rigid edges improve the wetting of the liquid silicon on the insulating support or blocks the droplet formation of the melted silicon. Moreover, they can have an influence on the crystalline orientation of the solidifying silicon.

BRIEF DESCRIPTION OF THE DRAWINGS

The invention is described in greater detail hereinafter relative to non-limitative embodiments and the attached drawings, wherein the attached

DETAILED DESCRIPTION OF THE PREFERRED EMBODIMENTS

Figure 1:
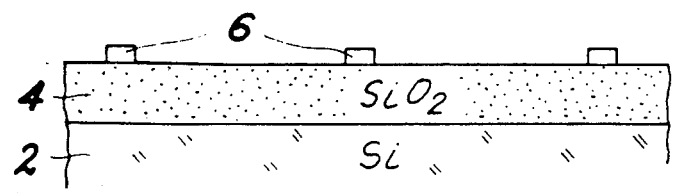
FIGS. 1 to 7 show different stages of the process for the production of a monocrystalline silicon film according to the invention, FIGS. 1 to 5 and 7 being longitudinal sectional views and FIG. 6 a plane view.

As shown in FIG. 1, the first stage of the process consists of completely covering the surface 2a of a monocrystalline silicon substrate 2 with an insulating material layer 4. Silicon substrate 2 e.g. has a crystalline orientation (100), i.e. an orientation perpendicular to the substrate surface 2a. The insulating material layer 4 can be produced either from silicon oxide, or from silicon nitride.

In the case of a silicon oxide layer 4, the latter can be obtained by thermal oxidation of substrate 2, under dry or wet oxygen at a temperature of 800° to 1100° C. Oxide layer 4 e.g. has a thickness of 0.5 to 1.5 $\mu$m.

On the insulating layer 4 is then formed an etching mask 6, which makes it possible to define the location and dimensions of the overhanging parts or steps to be produced in insulating layer 4. Mask 6 is e.g. a resin mask obtained according to conventional photolithography processes.

Figure 2:
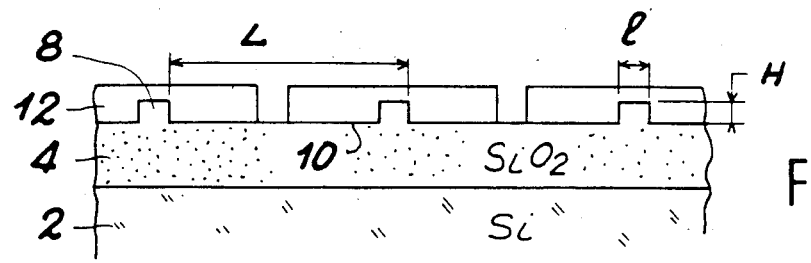

Through said mask 6 and as shown in FIG. 2, a first etching of insulating layer 4 is performed, in order to eliminate over a height H, those regions of the insulant not covered with resin. In the case of a 1 $\mu$m thick silicon oxide layer 4, said height H can be between 200 and 500 nm.

In order to obtain straight etched edges, the etching of the insulant layer can be carried out anistropically by means of a reactive ionic etching process using as the etching agent a carbon tetrafluoride or trifluoromethane plasma in the case of a silicon oxide layer 4.

This etching of insulating layer 4 makes it possible to form a preferably periodic configuration having overhanging parts or steps 8 which are similar, as well as similar recessed parts 10. These overhanging and recessed parts 8, 10 respectively are in the form of parallel insulating strips, which are preferably regularly spaced. Insulating strips 8, 10 advantageously extend from one edge to the other of the structure and are located in the plane of the insulating layer.

The width L of the recessed parts 10, above which can be produced the active zones of the integrated circuits exceeds the width 1 of the overhanging parts or steps 8. For example, the overhanging parts 8, above which will be localized the crystallization defects (grain boundaries and subboundaries) of the monocrystalline silicon film to be produced, have a width 1, which can vary from 3 to 6 μm. The recessed zones can have a width L from 20 to 100 μm for a diameter 100 mm substrate.

Following the etching of insulating layer 4, the resin mask 6 is eliminated, e.g. chemically using as the etching agent acetone or nitric acid, or alternatively an oxygen plasma.

On the structure obtained (FIG. 2) is optionally produced a second etching mask 12, e.g. of resin, in accordance with conventional photolithography processes, making it possible to define the location and dimensions of the notches to be produced, optionally in the recessed parts or strips 10 of the insulating layer 4.

Figure 3:
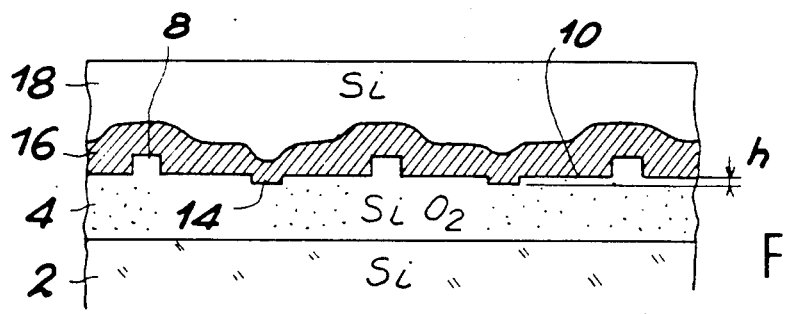

As shown in FIG. 3, this is followed by a second etching of insulating layer 4 in order to eliminate, over a height H, those parts of the insulating layer 4 not covered with resin. As hereinbefore, said etching is preferably carried out anisotropically in order to form rigid edges. Said etching is e.g. a reactive ionic etching using as the etching agent a carbon tetrafluoride or trifluoromethane plasma in the case of a silicon oxide layer 4. This etching of insulating layer 4 can be carried out over a height H ranging from 50 to 100 nm.

The notches obtained 14 are in the form of parallel strips, which are also parallel to the insulating strips 8, 10 of insulating layer 4. Advantageously notches 14 extend in the same way as steps 8 and recessed parts 10 from one end to the other of the insulating layer 4. The width of these notches is between 100 and 1000 nm.

During the recrystallization of the silicon film, these notches 14 make it possible to give a similar orientation of the silicon film in all the insulating recessed parts 10 and particularly using a non-coherent energy beam for recrystallizing the silicon film.

Although it is not necessary for these notches 14 to be located in the centre of recessed parts 10, it is preferable for silicon growth symmetry reasons. Each notch can advantageously be replaced by an etched periodic grating or network, whose period is constituted by the described elementary notch.

After producing the notches 14, resin mask 8 is eliminated, e.g. chemically using as the chemical etching agent acetone or nitric acid, or alternatively an oxygen plasma is used.

As shown in FIG. 3, the following stage of the process consists of covering the complete structure with a silicon film 16, whereby said silicon can either be amorphous silicon or polycrystalline silicon. The thickness of silicon film 16 is 0.2 to 1 μm. When the deposited silicon is polycrystalline silicon, the silicon film can be obtained by a low pressure chemical vapour phase deposition process (LPCVD) at a temperature of 625° C. by pyrolysis of $SiH_4$.

In the case where the silicon film 16 does not have a planar surface (FIG. 3), which is so when the overhanging parts or steps 8 are relatively high compared with the silicon film thickness, it is possible to flatten said surface by a planarization process. This flattening or levelling of the surface of silicon film 16 has the effect of reinforcing the localization of the defects intervening during the recrystallization of said film, in view of the fact that the energy contribution of the silicon - silicon dioxide interfaces can no longer be ignored.

This flattening of the surface of silicon film 16 (FIGS. 4 or 7) can e.g. be obtained by covering, as shown in fig 3, the film 16 with an insulating material layer 18 eliminating the relief of film 16. This insulating layer 18 is preferably made from resin, like that currently used in photolithography. The deposition of this resin layer 18, which in particular has a thickness of a few um, can be followed by a heat treatment, e.g. at a temperature of approximately 100° C. for 30 mn, so as to obtain a good spreading of the resin layer 18.

Figure 4:
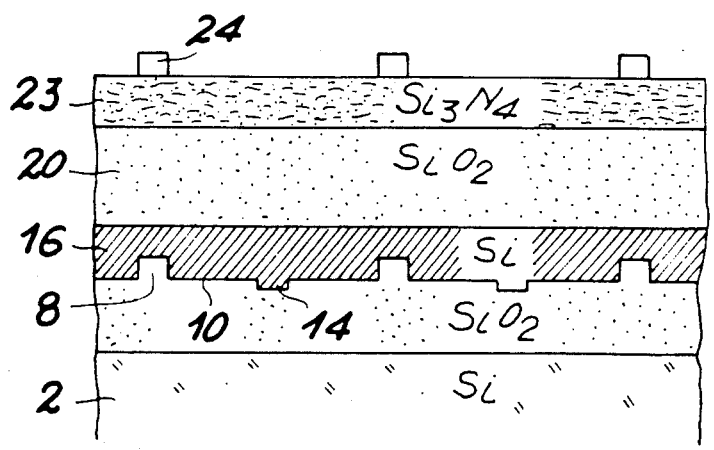

This is followed by the simultaneous etching of resin layer 18 and silicon film 16 at identical etching speeds for resin and silicon, until the resin layer 18 and consequently the relief zones of silicon film 16 are completely eliminated, as shown in FIG. 4. Said etching is preferably carried out anisotropically, e.g. using a reactive ionic etching process with as the etching agent a plasma of sulphur and hexafluoride and oxygen, the fluorinated compound being used for etching the silicon and the oxygen for etching the resin.

The following stage of the process consists of covering the optionally flattened silicon film 16 with an encapsulating layer 20, e.g. made from silicon oxide or silicon nitride, or even in the form of a two-layer material. This encapsulating material layer has in particular a thickness of 1 to 1.5 μm. It can be obtained by a low temperature, low pressure chemical vapour phase deposition process, e.g. at 430° C. by pyrolysis of $SiH_4 + O_2$, when the layer is of silicon oxide, or by cathodic sputtering when the layer is of silicon nitride.

Figure 5:
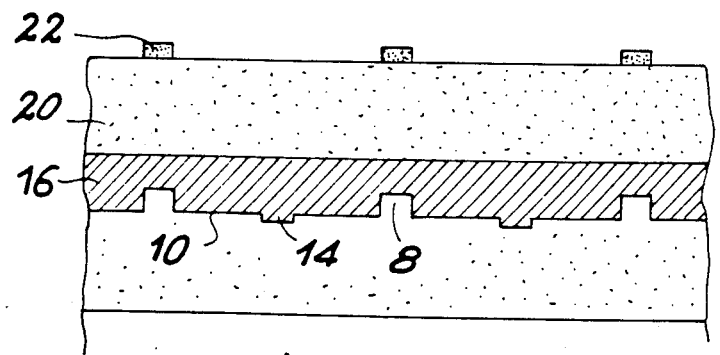

In the manner shown in FIG. 5, this is followed by the optional formation of antireflecting strips 22 on the encapsulating layer 20, which coincide with the overhanging parts 8 of the insulating layer 4. Each antireflecting strip 22 is positioned above an insulating overhanging part 8. These antireflection strips 22 extend right across the structure and have a width identical to that of the overhanging parts or steps 8. these strips 22 can be made from a carbon-containing resin of the type described in the aforementioned article by M. W. GEIS published in J Electro chem Soc, or silicon nitride.

In the case of silicon nitride strips, as shown in FIG. 4, they can be obtained by depositing a silicon nitride layer 23 on the encapsulating layer 20 having a thickness of 80 to 150 nm. The silicon nitride layer 23 can e.g. be deposited by a chemical vapour phase deposition process at a temperature of 800° C. or, in the case of a silicon oxide encapsulating layer 20, by nitriding said oxide at a temperature of approximately 950° C.

This is followed by the production on the nitride layer 23 of an etching mask 24, e.g. of resin, using conventional photolithography processes. This etching mask 24 makes it possible to define the location and dimensions of the antireflecting strips 24 to be produced and is identical to the resin mask 6 used for etching oxide layer 4 for forming the overhanging and recessed insulating parts 8, 10 respectively.

The silicon nitride layer 23 is etched through mask 24 until those parts of the layer not covered with resin are completely eliminated. This etching can be carried out chemically using orthophosphoric acid as the etching agent, or by reactive ionic etching using a sulphur hexafluoride plasma as the etching agent. As shown in FIG. 5, this etching makes it possible to obtain antireflecting strips 22 representing the same pattern as that of the overhanging parts 8.

The effect of these antireflecting strips 22 is to reinforce, during the recrystallization stage, the localization of the crystallization defects (grain boundaries and sub-boundaries) above the overhanging parts 8. These refractive index adapting and recrystallization delaying strips 24 in particular make it possible to reduce the height H of the overhanging parts 8 and consequently tend to flatten the surface of silicon film 16, making it possible to obviate the aforementioned planarization process (FIG. 3).

The following stage of the process consists of subjecting the structure obtained, shown in FIG. 5, to a heat treatment making it possible to recrystallize the silicon film 16 in monocrystalline form.

This heat treatment firstly comprises a preheating stage consisting of placing the complete structure in an oven and raising its temperature to below the melting point of the silicon, which is 1410° C. For example, the structure can be heated to 800° to 1200° C. In the case of an amorphous silicon film 16, this preheating stage permits the crystallization thereof into large polycrystalline silicon grains oriented (100) parallel and perpendicular to the edges of notches 14. These large grains will serve as nuclei for the recrystallization in monocrystalline form, as well as for the orientation of the silicon. The orientation of these large silicon grains is mainly due to the existence of notches 14.

Following this preheating stage, local melting of silicon film 16 takes place and the thus obtained melted zone is moved in direction X (FIG. 6) parallel to the antireflecting strips 22, when the latter are used, or better still parallel to the insulating strips 8, at a relatively slow speed and in particular below 0.5 mm/s. Preferably the melted zone scanning speed varies from 0.1 to 0.2 mm/s.

Figure 6:
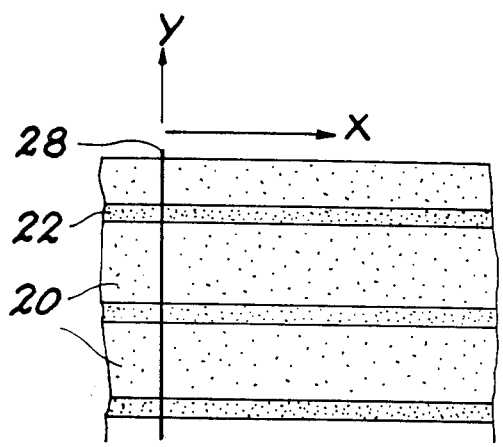

The melted silicon zone is in the form of a line, e.g. 2 to 5 mm wide, whereof the length is at least equal to that of the industrial silicon wafer (diameter 100 mm). This melted zone line can advantageously be realized, as shown in FIG. 6, by subjecting the surface of the structure to an energy line 28 oriented in direction Y perpendicular to the insulating strips 8 or antireflecting strips 22 when they exist. This energy line 28 moves parallel to said strips in direction X.

Energy line 28 can advantageously be produced with the aid of a high power energy beam focused onto the surface of the structure and more particularly as described in French patent application No. 83 163 96 by rapidly scanning the surface of the structure and in particular the encapsulating material layer 20 with a laser or electron beam in direction Y perpendicular to the insulating strips 8 or antireflecting strips 22. In the case of a laser beam, said fast scan in direction Y can be carried out at a frequency exceeding 10 khZ. Furthermore, the laser power used can be between 10 and 25 W.

Figure 7:
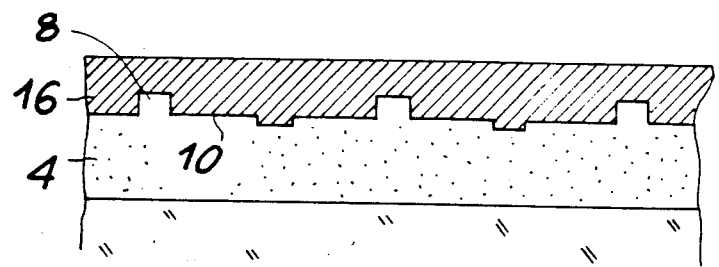

As shown in FIG. 7, the following stage of the process consists of eliminating the possible antireflecting strips 22, e.g. chemically using an orthophosphoric acid bath when the antireflecting strips are made from silicon nitride. In the same way, the encapsulating material layer 20 is eliminated by chemical etching in a hydrofluoric acid bath when said layer is of silicon oxide. The final structure is shown in FIG. 7.

The above process makes it possible to obtain wide strips (recessed parts 10) of defect-free monocrystalline silicon, e.g. 40 μm wise and 100 mm long, having an orientation (100), on which can be produced the active zones of integrated circuits and particularly MOS or bipolar circuits. The residual defects, such as boundaries and subboundaries of grains or other dislocations, which cannot be eliminated during the crystallization of the silicon film, are exclusively located between the monocrystalline strips, i.e. level with steps 8 and typically have a width of 4 μm and a length of 100 mm.

The different stages of the process according to the invention have the advantage of being simple, easy to reproduce and easy to control by the Expert.

The above description has obviously only been given in an illustrative and all modifications can be envisaged without passing beyond the scope of the invention. In particular, the thickness of the different layers, the nature thereof and there deposition and etching processes can be modified. In the same way, the dimensions of insulating strips 8, 10, notches 14 and antireflection strips can be modified. Moreover, their arrangement is not necessarily a periodic structure.

Moreover, certain stages of the process can sometimes be eliminated. For example, the stages leading to the production of notches 14 in the insulating support are unnecessary when the silicon film deposited on said support is a polycrystalline silicon film.

In the same way, if the overhanging parts of steps 8 have relatively large height H, i.e. exceeding 0.5 μm for a 1 μm insulating layer, it will not be necessary to use the refractive index adapting or solidification delaying strips 22 for permitting a localization of the silicon crystallization defects at the insulating steps 8. However, the use of steps 8 of considerable thickness make it necessary to use a planarization stage, if it is wished to obtain a silicon film with a perfectly planar surface (FIG. 7). In the case of a thick silicon film (approximately 1 μm), the different known silicon deposition methods make it possible to obtain a film with a sufficiently planar surface without using the planarization stage.

Moreover, the heat treatment permitting the crystallization of the silicon film can be carried out with a process differing from that described. In particular, the preheating of the structure and the fast scanning in a direction Y perpendicular to the insulatiing steps 8 of a laser or electron beam can be carried out using the heating device described in French patent application 2 532 783.

Finally, a recrystallization of an insulated silicon film on an orientation substrate has been described, but any other orientation can be envisaged. It is even possible to envisage the use of polycrystalline substrates.

What is claimed is:

1. A process for the production of a monocrystalline silicon film on an insulating support, comprising the steps of:
   (a) etching an insulating support in a manner which produces overhanging insulating strips and recessed insulating strips thereon, said strips being parallel and alternating with each other with the width of the overhanging strips being less than the width of the recessed strips;
   (b) depositing a silicon film on the etched structures;
   (c) covering the deposited silicon film with an encapsulating material as a layer;
   (d) heat treating the structure in order to recrystallize the silicon film in monocrystalline form, said treatment consisting of locally melting the silicon film and moving the melted zone parallel to the insulating strips, the melted zone being in the form of a line which is perpendicular to said strips; and
   (e) removing the layer of encapsulating material.

2. The production process according to claim 1, wherein the overhanging and recessed strips are arranged in a periodic configuration.

3. The production process according to claim 1, which further comprises, prior to step (d), forming a crystallization delaying strip on the encapsulating material layer above each overhanging strip, said crystallization delaying strip having the same width as the associated overhanging strip.

4. The production process according to claim 1, wherein the melted zone is displaced at a speed below 0.5 mm/s.

5. The production process according to claim 1, wherein the melted zone is displaced at a speed of 0.1 to 0.2 mm/s.

6. The production process according to claim 1, wherein the heat treatment takes place by subjecting the structure to the action of an energy line perpendicular to the insulating strips and moving parallel to said strips.

7. The production process according to claim 5, wherein an energy line is formed by rapidly scanning the surface of the encapsulating material layer with an energy beam in a direction perpendicular to the insulating strips.

8. The production process according to claim 1, wherein at least one notch is formed in each recessed strip, by etching the insulating support, said notches being in the form of strips parallel to the overhanging strips.

9. The production process according to claim 8, wherein each notch is produced in the centre of each recessed part.

10. The production process according to claim 3, wherein the crystallization delaying strips are formed by covering the encapsulating material layer with a layer of a crystallization delaying material and by etching the latter with a pattern identical to that of the overhanging strips.

11. The production process according to claim 1, which further comprises, before stage (c), depositing an insulating material as a layer on the silicon film thereby eliminating the relief of the latter, followed by simultaneous etching of the insulating material layer and the silicon film at identical etching speeds for insulant and silicon until the insulating material layer and the relief parts of the silicon are completely eliminated, in order to flatten the surface of said silicon film.

12. The production process according to claim 8, wherein the insulating support is etched to form recessed strips and/or notches by a reactive ionic etching process.

13. The production process according to claim 1, wherein the insulating support and/or encapsulating material layer are made from silicon oxide.

14. The production process according to claim 1, wherein stage b) consists of depositing an amorphous or polycrystalline silicon film on the etched structure.

15. The production process according to any one of the claims 2 to 14 and 1, wherein the heat treatment comprises a stage of preheating the structure obtained at a temperature below the melting point of the silicon.

16. The production process according to claim 3, wherein the crystallization delaying strips are silicon nitride strips.

17. The production process according to claim 3, wherein the crystallization delaying strips are formed with an antireflecting material when the heat treatment takes place by subjecting the structure to the action of a light beam.

* * * * *

UNITED STATES PATENT AND TRADEMARK OFFICE
CERTIFICATE OF CORRECTION

PATENT NO. : 4,773,964
DATED : Sep. 27, 1988
INVENTOR(S) : Michel HAOND

It is certified that error appears in the above-identified patent and that said Letters Patent is hereby corrected as shown below:

On the Title Page, Item [30]:

Please correct the Foreign Application Priority Data to read as follows:

-- Apr. 19, 1985  [FR]  France ..................85 06001 --

Signed and Sealed this

Fourteenth Day of March, 1989

Attest:

DONALD J. QUIGG

*Attesting Officer*   *Commissioner of Patents and Trademarks*